US012575310B2

(12) United States Patent
Shim et al.

(10) Patent No.: US 12,575,310 B2
(45) Date of Patent: Mar. 10, 2026

(54) DISPLAY APPARATUS HAVING A REPAIR WIRING

(71) Applicant: LG DISPLAY CO., LTD., Seoul (KR)

(72) Inventors: Sung Bin Shim, Paju-si (KR); Sang Pil Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 405 days.

(21) Appl. No.: 18/369,224

(22) Filed: Sep. 18, 2023

(65) Prior Publication Data

US 2024/0224768 A1 Jul. 4, 2024

(30) Foreign Application Priority Data

Dec. 30, 2022 (KR) ........................ 10-2022-0191244

(51) Int. Cl.
  *H10K 59/88* (2023.01)
  *H10K 59/12* (2023.01)
  (Continued)

(52) U.S. Cl.
  CPC ....... *H10K 71/861* (2023.02); *H10K 59/1201* (2023.02); *H10K 59/1315* (2023.02);
  (Continued)

(58) Field of Classification Search
  CPC ......................... H10K 71/861; H10K 59/1315
  See application file for complete search history.

(56) References Cited

U.S. PATENT DOCUMENTS 9,911,799 B2 * 3/2018 Cho ...................... H10D 86/423
10,049,616 B2 * 8/2018 Seo ...................... G09G 3/3233
  (Continued)

FOREIGN PATENT DOCUMENTS

JP 2005043639 A 2/2005
JP 2006030782 A 2/2006
  (Continued)

OTHER PUBLICATIONS

Japanese Office Action issued Jul. 2, 2024 in Patent Application No. 2023-189749.

*Primary Examiner* — Daniel Luke
(74) *Attorney, Agent, or Firm* — PnK IP LLC

(57) ABSTRACT

A display apparatus includes a plurality of pixel areas. The repair wiring may include a first repair wiring in each pixel area and a second repair wiring extending beyond the corresponding pixel area. The first repair wiring of each pixel area may cross a repair cutting region of the corresponding pixel area. The second repair wiring may include a region overlapping with a repair connecting region of one of adjacent two pixel areas. Each of the first repair wiring and the second repair wiring may have a stacked structure of a lower wiring layer and an upper wiring layer. The lower wiring layer and the upper wiring layer may have a relative high transmittance. The upper wiring layer may have an energy absorption rate higher than the lower wiring layer. The upper wiring layer of the first repair wiring may be disposed outside the repair cutting region. Thus, in the display apparatus, a decrease in aperture ratio due to the first repair wiring and the second repair wiring may be prevented, without a decrease in process efficiency.

22 Claims, 9 Drawing Sheets

(51) Int. Cl.
  *H10K 59/131*        (2023.01)
  *H10K 71/00*        (2023.01)
  *G09G 3/325*        (2016.01)

(52) U.S. Cl.
  CPC ............. *H10K 59/88* (2023.02); *G09G 3/325*
              (2013.01); *G09G 2330/08* (2013.01)

(56)                References Cited

U.S. PATENT DOCUMENTS

| | | | | |
|---|---|---|---|---|
| 10,541,296 B2 * | 1/2020 | Choi | .................... | H10K 59/131 |
| 11,404,527 B2 * | 8/2022 | Furukawa | ............ | G09G 3/3233 |
| 2020/0212131 A1 * | 7/2020 | Kim | ................... | H10K 59/1315 |
| 2021/0098551 A1 * | 4/2021 | Lee | ..................... | H10K 59/131 |

FOREIGN PATENT DOCUMENTS

| | | |
|---|---|---|
| JP | 2008500562 A | 1/2008 |
| JP | 2014203081 A | 10/2014 |
| KR | 10-2021-0039160 A | 4/2021 |

* cited by examiner

DISPLAY APPARATUS HAVING A REPAIR WIRING

CROSS-REFERENCE TO RELATED APPLICATION

This application claims the priority of Korean Patent Application No. 10-2022-0191244, filed on Dec. 30, 2022, which is hereby incorporated by reference in its entirety.

BACKGROUND

Field of the Disclosure

The present disclosure relates to a display apparatus including a repair wiring for a repair process of a defective pixel area.

Description of the Background

Generally, a display apparatus provides an image to user. For example, the display apparatus may include a plurality of pixel areas. Each of the pixel areas may realize a specific color. For example, at least a pixel driving circuit and a light-emitting device electrically connected to the pixel driving circuit may be disposed in each pixel area.

The pixel driving circuit may provide a driving current corresponding to a data signal to the light-emitting device according to a gate signal. The light-emitting device may emit light having a luminance corresponding to the driving current. For example, the light-emitting device may include a lower electrode, a light-emitting layer and an upper electrode, which are sequentially stacked.

The pixel driving circuit of each pixel area may be damaged by foreign matters such as particle, moisture, etc. generated during a process or an external impact. The pixel area in which the pixel driving circuit does not normally operate may be recognized as a dark spot by the user, and the dark spot may become larger and larger as time goes by, making it impossible to realize the desired image. Thus, in the display apparatus, a repair process of electrically connecting the light-emitting device of the pixel area where the pixel driving circuit is damaged to the pixel driving circuit of another (e.g., adjacent) pixel area may be performed.

The repair process may include a cutting, transferring, bonding and/or connecting process using a laser. For example, the repair wiring may include a specific material such as metal. Therefore, in the display apparatus, in a transparent display apparatus in which each of the pixel areas includes a transmissive area, an aperture ratio may be decreased by the repair process, for example, due to the material of the repair wiring. In particular, the transmittance and the aperture ratio may be greatly decreased by the repair wiring.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

Accordingly, the present disclosure is directed to a display apparatus having a repair wiring that substantially obviates one or more problems due to limitations and disadvantages described above.

More specifically, the present disclosure is to provide a display apparatus capable of preventing or reducing a decrease of an aperture ratio due to a repair process.

The present disclosure is also to provide a display apparatus capable of simplifying a repair process.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the present disclosure, as embodied and broadly described herein, there is provided a display apparatus comprising a device substrate. A pixel driving circuit is disposed on a pixel area of the device substrate. The pixel driving circuit is electrically connected to a first repair wiring. The first repair wiring cross a repair cutting region of the pixel area. The first repair wiring is electrically connected to a dummy wiring. The dummy wiring includes a region overlapping with a repair connecting region of the pixel area. A second repair wiring is disposed between the device substrate and the dummy wiring in the repair connecting area. The second repair wiring extends beyond the pixel area. The dummy wiring is electrically connected to a light-emitting device. The light-emitting device has a stacked structure of a lower electrode, a light-emitting layer and an upper electrode. Each of the first repair wiring and the second repair wiring has a stacked structure of a lower wiring layer and an upper wiring layer. The upper wiring layer has an energy absorption rate higher than the lower wiring layer. The lower wiring layer and the upper wiring layer have a transmittance higher than the lower electrode. The upper wiring layer of the first repair wiring is disposed outside the repair cutting region.

The lower electrode of the light-emitting device may be connected to the dummy wiring between the repair cutting region and the repair connecting region.

The pixel driving circuit may include at least one thin film transistor. The thin film transistor may include a semiconductor pattern. The lower wiring layer may include a same material as a channel region of the semiconductor pattern.

The lower wiring layer and the channel region of the semiconductor pattern may include an oxide semiconductor.

A source region and a drain region of the semiconductor pattern may include a first semiconductor layer and a second semiconductor layer, respectively. The first semiconductor layer may include a same material as the channel region. The second semiconductor layer may be disposed on the first semiconductor layer. The upper wiring layer may include a same material as the second semiconductor layer.

The semiconductor pattern may be covered by an interlayer insulating layer. The interlayer insulating layer may extend between the second repair wiring and the dummy wiring in the repair connecting region.

The thin film transistor may include a gate electrode. The gate electrode may be disposed on the channel region of the semiconductor pattern. The dummy wiring may include a same material as the gate electrode. The dummy wiring may include a region disposed between the upper wiring layer of the first repair wiring and the lower electrode of the light-emitting device.

In another aspect of the present disclosure, a display apparatus includes a device substrate. The device substrate includes a first pixel area and a second pixel area. A pixel driving circuit and a first light-emitting device are disposed on the first pixel area of the device substrate. The first light-emitting device has a stacked structure of a first lower electrode, a first light-emitting layer and a first upper electrode. A second light-emitting device is disposed on the second pixel area. The second light-emitting device has a stacked structure of a second lower electrode, a second light-emitting layer and a second upper electrode. The pixel driving circuit and the first lower electrode of the first light-emitting device are electrically connected to a first repair wiring. The second lower electrode of the second light-emitting device is electrically connected to a dummy wiring. The dummy wiring extends on a repair connecting area of the second pixel area. A second repair wiring electrically connected to the first repair wiring extends on the second pixel area. The first repair wiring includes a first lower wiring layer and a first upper wiring layer. The first lower wiring layer crosses a repair cutting region of the first pixel area. The first upper wiring layer is disposed outside the repair cutting region. The second repair wiring includes a second lower wiring layer and a second upper wiring layer. The second lower wiring layer and the second upper wiring layer are stacked between the device substrate and the dummy wiring in the repair connecting region. The first repair wiring and the second repair wiring have a transmittance higher than the first lower electrode and the second lower electrode. The first upper wiring layer and the second upper wiring layer may have an energy absorption rate higher than the first lower wiring layer and the second lower wiring layer.

The first upper wiring layer and the second upper wiring layer may have a resistance lower than the first lower wiring layer and the second lower wiring layer.

The second lower wiring layer may include a same material as the first lower wiring layer. The second upper wiring layer may include a same material as the first upper wiring layer.

The second lower wiring layer may be in contact with the first lower wiring layer. The second upper wiring layer may be in contact with the first upper wiring layer.

A pixel driving circuit may include at least one thin film transistor. The thin film transistor may include a drain electrode. The drain electrode may be connected to the first upper wiring layer of the first repair wiring.

The dummy wiring may include a same material as the drain electrode.

The first lower electrode and the second lower electrode may include a metal. The first lower wiring layer, the second lower wiring layer, the first upper wiring layer and the second upper wiring layer may include a conductive metal oxide.

According to embodiments of the disclosure, a decrease in the aperture ratio due to the repair wiring may be prevented or at least reduced.

According to embodiments of the disclosure, a decrease in the process efficiency due to the repair process using repair wiring may be minimized or reduced, and the production energy may be reduced by process optimization.

According to embodiments of the disclosure, an overall aperture ratio may be increased by repair wiring having a relative high transmittance, and low power driving may be possible.

BRIEF DESCRIPTION OF THE DRAWINGS

The accompanying drawings, which are included to provide a further understanding of the present disclosure and are incorporated in and constitute a part of this application, illustrate aspect (s) of the present disclosure and together with the description serve to explain the principle of the present disclosure:

In the drawings:

FIGS. 7 to 9 are views for explaining a repair process in the display apparatus according to the aspect of the present disclosure; and FIGS. 10 and 11 are views showing the display apparatus according to another aspect of the present disclosure.

DETAILED DESCRIPTION

Figure 1:
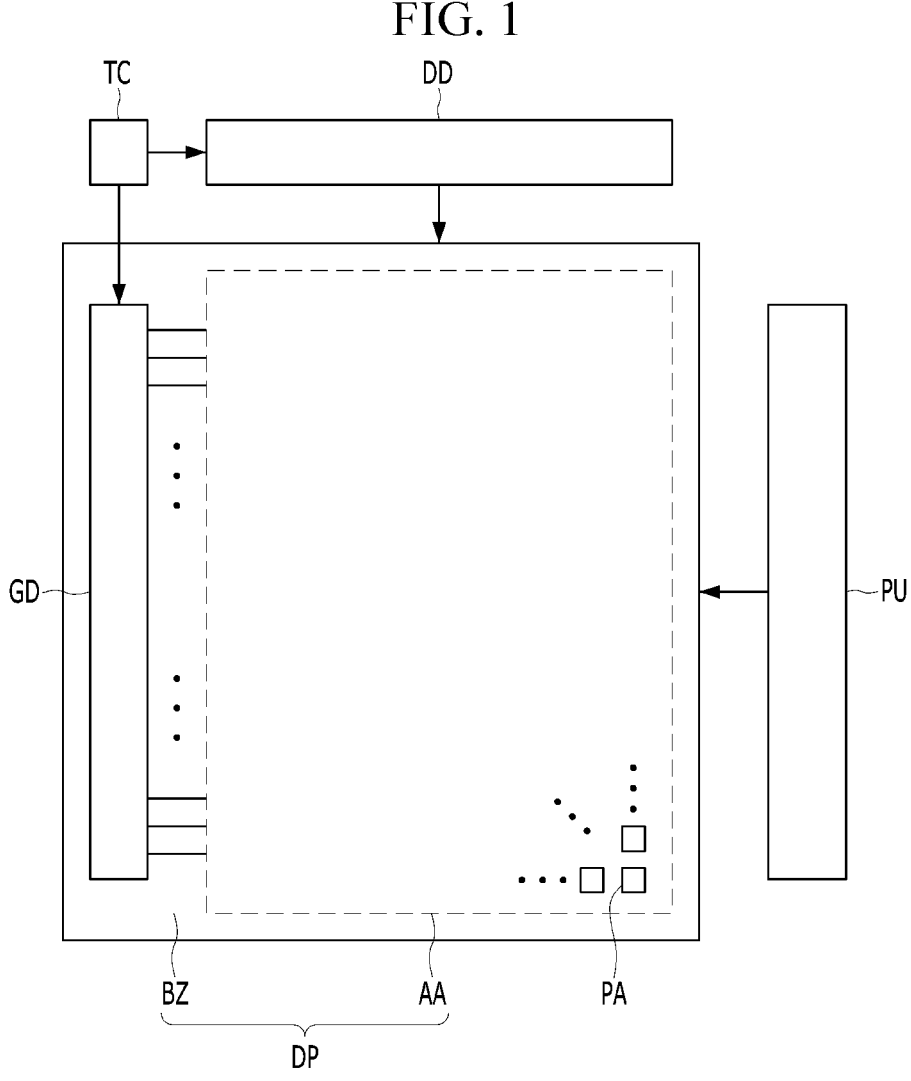
FIG. 1 is a view schematically showing a display apparatus according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
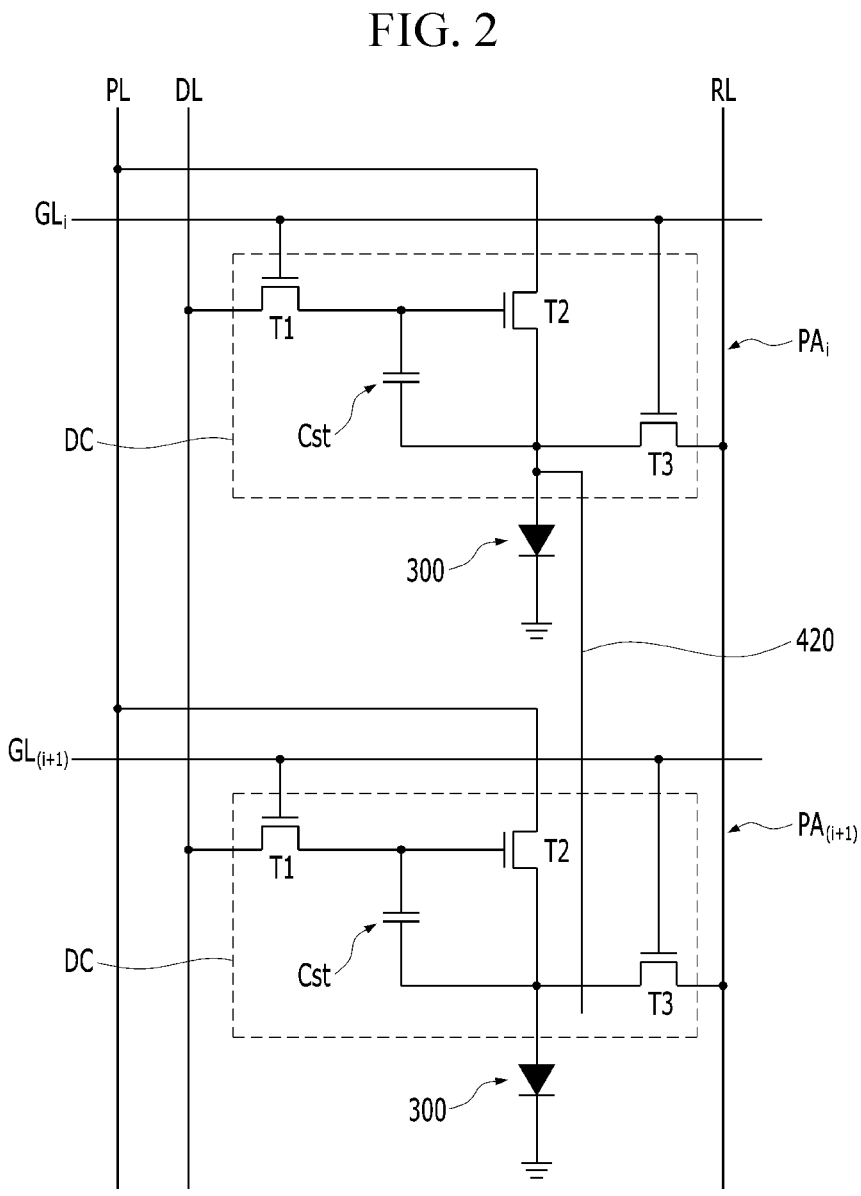
FIG. 2 is a view showing a circuit of an i-th pixel area and an (i+1)-th pixel area in the display apparatus according to the aspect of the present disclosure.

FIG. 1 is a view schematically showing a display apparatus according to an aspect of the present disclosure. FIG. 2 is a view showing a circuit of an i-th pixel area and an (i+1)-th pixel area in the display apparatus according to the aspect of the present disclosure.

Referring to FIGS. 1 and 2, the display apparatus according to the aspect of the present disclosure may include a display panel DP. The display panel DP may generate an image provided to a user. For example, the display panel DP may include a plurality of pixel areas PA.

Various signals may be provided in each pixel area PA through signal wirings $GL_i$, $GL_{(i+1)}$, DL, PL, RL and the like. For example, the signal wirings $GL_i$, $GL_{(i+1)}$, PL and RL may include gate lines $GL_i$ and $GL_{(i+1)}$ applying a gate signal to each pixel area PA, data lines DL applying a data signal to each pixel area PA, power voltage supply lines PL supplying a power voltage to each pixel area PA, and reference voltage supply lines RL applying a reference voltage to each pixel area PA, but are not limited thereto. For example, the signal wirings may also include touch lines, scanning lines or sensing line. The gate lines $GL_i$ and $GL_{(i+1)}$ may be electrically connected to a gate driver GD. The data lines DL may be electrically connected to a data driver DD. The gate driver GD and the data driver DD may be controlled by a timing controller TC. For example, the gate driver GD may receive clock signals, reset signals and start signals from the timing controller TC, and the data driver DD may receive digital video data and a source timing signal from the timing controller TC. The power voltage supply lines PL and the reference voltage supply lines RL may be electrically connected to a power unit PU.

The display panel DP may include a display area AA in which the pixel areas PA are disposed, and a bezel area BZ (also referred to as "non-display area") disposed outside the display area AA. At least one of the gate driver GD, the data driver DD, the power unit PU and the timing controller TC may be disposed on the bezel area BZ of the display panel DP. For example, the display apparatus according to the aspect of the present disclosure may be a GIP (Gate In Panel) type display apparatus in which the gate driver GD is formed in the bezel area BZ of the display panel DP, but is not limited thereto. For example, the display apparatus according to the exemplary embodiment of the present disclosure may also be, for example, a chip on glass (COG) or a chip on film (COF) type display apparatus.

Each of the pixel areas PA may realize a specific color such as red, green, blue, white, cyan, magenta, or yellow, etc. For example, a pixel driving circuit DC electrically connected to a light-emitting device 300 may be disposed in each pixel area PA. The pixel driving circuit DC of each pixel area PA may be disposed on a device substrate 100. The device substrate 100 may include an insulating material. For example, the device substrate 100 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto, but is not limited thereto.

The pixel driving circuit DC of each pixel area PA may supply a driving current corresponding to the data signal to the light-emitting device 300 of the corresponding pixel area PA according to the gate signal for one frame. For example, the pixel driving circuit DC of each pixel area PA may include a first thin film transistor T1, a second thin film transistor T2, a third thin film transistor T3 and a storage capacitor Cst which is called a 3T1C structure, but is not limited thereto. For example, 2T1C structure, 3T1C structure, 4T1C structure, 4T2C structure and etc. are also possible. And more or less transistors and capacitors could be included.

Figure 3:
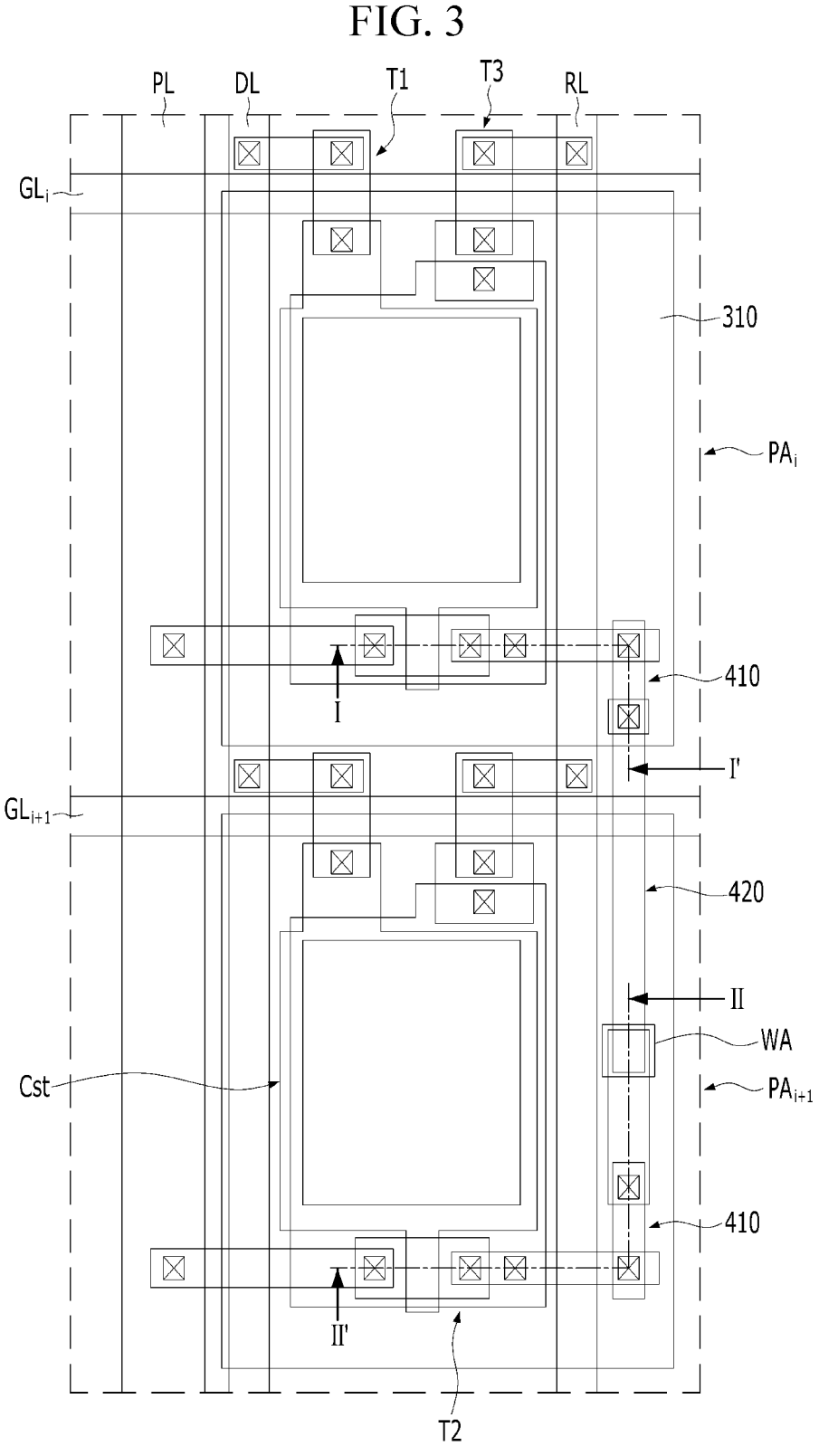
FIG. 3 is a plan view of i-th pixel area and (i+1)-th pixel area in the display apparatus according to the aspect of the present disclosure.
Figures 4, 5:
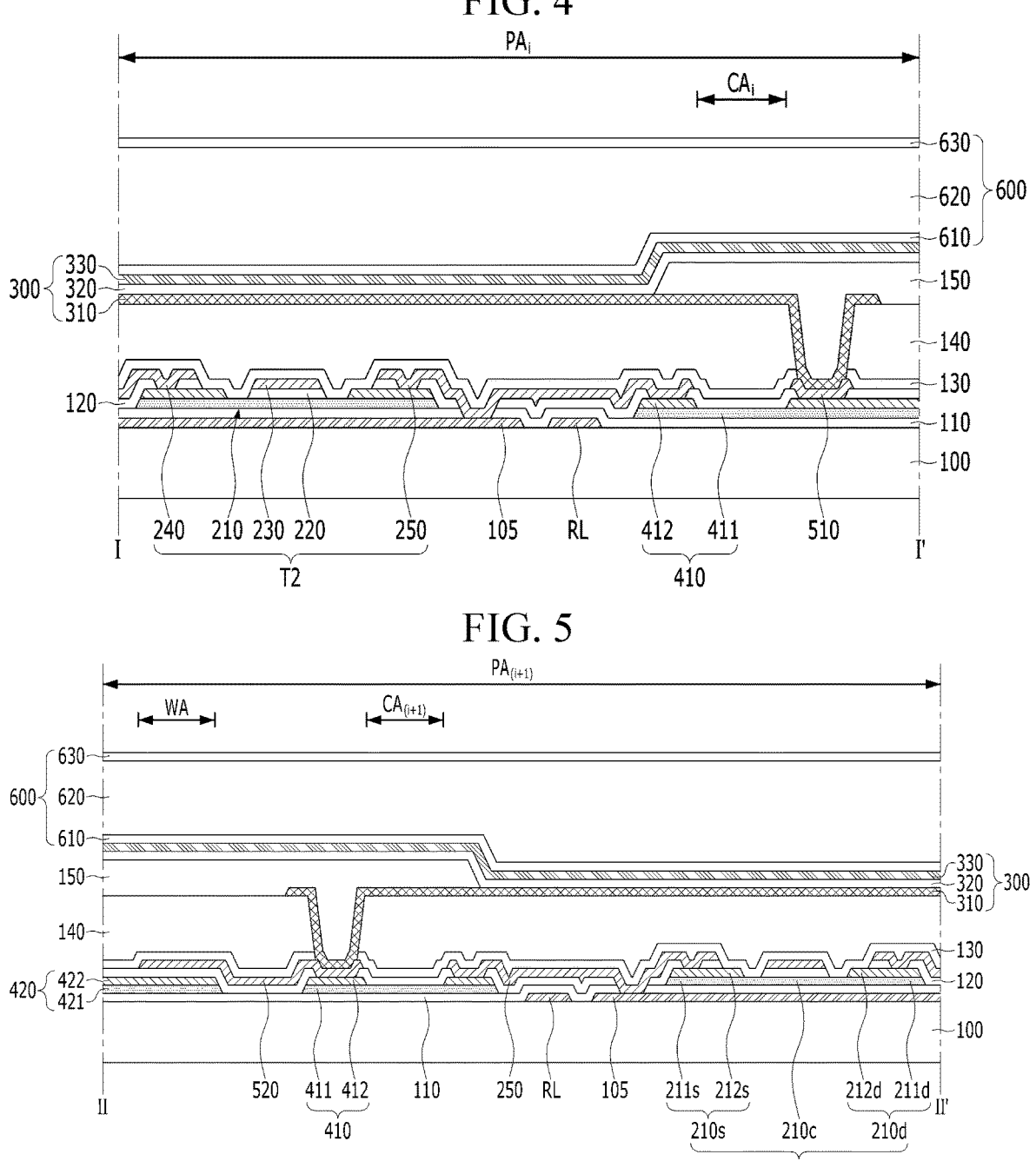
FIG. 4 is a view taken along I-I' of FIG. 3.
FIG. 5 is a view taken along II-II' of FIG. 3.

FIG. 3 is a plan view of i-th pixel area and (i+1)-th pixel area, which are disposed side by side in a first (e.g., vertical) direction in the display apparatus according to the aspect of the present disclosure. FIG. 4 is a view taken along I-I' of FIG. 3. FIG. 5 is a view taken along II-II' of FIG. 3.

Referring to FIGS. 2 to 5, the first thin film transistor T1 may include a first semiconductor pattern, a first gate insulating layer, a first gate electrode, a first source electrode and a first drain electrode. The first thin film transistor T1 may transmit the data signal to the second thin film transistor T2 according to the gate signal. For example, the first thin film transistor T1 may be a switching thin film transistor. In the display apparatus according to the embodiment of the present disclosure as shown in FIG. 3, the first gate electrode may be electrically connected to one of the gate lines $GL_i$ and $GL_{(i+1)}$, and the first drain electrode may be electrically connected to one of the date lines DL, but is not limited thereto, the first gate electrode may be electrically connected to other gate lines.

The second thin film transistor T2 may include a second semiconductor pattern 210, a second gate insulating layer 220, a second gate electrode 230, a second source electrode 240 and a second drain electrode 250. The second thin film transistor T2 may generate the driving current corresponding to the data signal. For example, the second thin film transistor T2 may be a driving thin film transistor. The second gate electrode 230 may be electrically connected to the first source electrode of the first thin film transistor T1, the second source electrode 240 may be electrically connected to one of the power voltage supply lines PL, and second drain electrode 250 may be electrically connected to an anode of light-emitting device 300.

The second semiconductor pattern 210 may include a source region 210s, a channel region 210c and a drain region 210d. The channel region 210c may be disposed between the source region 210s and the drain region 210d and overlapped with the gate electrode 230. A resistance of the source region 210s and a resistance of the drain region 210d may be lower than a resistance of the channel region 210c. The source region 210s and the drain region 210d may have a multi-layer structure. For example, the source region 210s may have a stacked structure of a first semiconductor layer 211s and a second semiconductor layer 212s, and the drain region 210d may have a stacked structure of a first semiconductor layer 211d and a second semiconductor layer 212d.

The channel region 210c and the first semiconductor layer 211s and 211d may include a semiconductor material. The channel region 210c and the first semiconductor layer 211s and 211d may include a material having a relative high transmittance. For example, the channel region 210c and the first semiconductor layer 211s and 211d may include an oxide semiconductor, such as IGZO (indium-gallium-zinc-oxide), ITZO (indium tin zinc oxide), ITGZO (indium tin gallium zinc oxide), zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium gallium tin oxide (IGTO), but is not limited thereto. The first semiconductor layer 211s and 211d may include a same material as the channel region 210c. For example, the first semiconductor layer 211s and 211d and the channel region 210c may be a region of an oxide semiconductor which is not conductive. A resistance of the first semiconductor layer 211s and 211d may be the same as a resistivity of the channel region 210c.

The first semiconductor layer 211s and 211d may be disposed on a same layer as the channel region 210c. For example, the first semiconductor layer 211s of the source region 210s and the first semiconductor layer 211d of the drain region 210d may be formed simultaneously with the channel region 210c. The channel region 210c may be in direct contact with the first semiconductor layer 211s of the source region 210s and the first semiconductor layer 211d of the drain region 210d. For example, a boundary surface between the first semiconductor layer 211s of the source region 210s and the channel region 210c and a boundary surface between the channel region 210c and the first semiconductor layer 211d of the drain region 210d may be not recognized. Thus, in the display apparatus according to the aspect of the present disclosure, an internal resistance of the second semiconductor pattern 210 may be minimized or reduced.

The second semiconductor layer 212s and 212d may be disposed on the first semiconductor layer 211s and 211d. For example, the first semiconductor layer 211s and 211d may be disposed between the device substrate 100 and the second semiconductor layer 212s and 212d. The second semiconductor layer 212s and 212d may be disposed outside the channel region 210c in the horizontal direction. For example, in the horizontal direction, the channel region 210c may be disposed between the second semiconductor layer 212s of the source region 210s and the second semiconductor layer 212d of the drain region 210d.

The second semiconductor layer 212s and 212d may be in direct contact with the first semiconductor layer 211s and 211d. For example, a lower surface of the second semiconductor layer 212s of the source region 210s toward the device substrate 100 may be in direct contact with an upper surface of the first semiconductor layer 211s of the source region 210s opposite to the device substrate 100. A lower surface of the second semiconductor layer 212d of the drain region 210d toward the device substrate 100 may be in direct contact with an upper surface of the first semiconductor layer 211d of the drain region 210d opposite to the device substrate 100. Thus, in the display apparatus according to the aspect of the present disclosure, the resistance of the source region 210s and the resistance of the drain region 210d may be minimized or reduced.

The second semiconductor layer 212s and 212d may include a material different from the first semiconductor layer 211s and 211d. The second semiconductor layer 212s and 212d may include a material having a relative high transmittance. A resistivity of the second semiconductor layer 212s and 212d may be lower than the resistivity of the first semiconductor layer 211s and 211d. For example, the second semiconductor layer 212s and 212d may include a conductive metal oxide, such as ITO (indium-tin-oxide), indium gallium oxide (IGO), and IZO (indium-zinc-oxide), etc.

The first semiconductor pattern may have a same structure as the second semiconductor pattern 210. For example, the first semiconductor pattern may include a channel region disposed between a source region and a drain region, the source region and the drain region of the first semiconductor pattern may have a double-layer structure, respectively. The first semiconductor pattern may be formed simultaneously with the second semiconductor pattern 210. For example, the channel region of the first semiconductor pattern may include a same material as the channel region 210c of the second semiconductor pattern 210. The channel region of the first semiconductor pattern may have a same resistivity as the channel region 210c of the second semiconductor pattern 210. The channel region of the first semiconductor pattern may have a same thickness as the channel region 210c of the second semiconductor pattern 210. The source region and the drain region of the first semiconductor pattern may have a same resistivity as the source region 210s and the drain region 210d of the second semiconductor pattern 210.

The second gate insulating layer 220 may be disposed on the channel region 210c of the second semiconductor pattern 210. For example, the source region 210s and the drain region 210d of the second semiconductor pattern 210 may be disposed outside the second gate insulating layer 220 in horizontal direction. The second gate insulating layer 220 may be disposed between the second semiconductor layer 212s of the source region 210s and the second semiconductor layer 212d of the drain region 210d. The second gate insulating layer 220 may include an insulating material. For example, the second gate insulating layer 220 is an insulating layer for insulating the active layer 210 and the gate electrode 230 from each other, may include a single layer or multilayers of an inorganic insulating material, such as silicon oxide (SiOx), silicon nitride (SiNx), silicon oxide nitride (SiONx), etc., but not limited thereto.

The first gate insulating layer may include a same material as the second gate insulating layer 220. For example, the second gate insulating layer 220 may be formed simultaneously with the first gate insulating layer. A thickness of the first gate insulating layer may be the same as a thickness of the second gate insulating layer 220.

The second gate electrode 230 may include a conductive material. For example, the second gate electrode 230 may include metal, such as aluminum (Al), chrome (Cr), copper (Cu), molybdenum (Mo), titanium (Ti) and tungsten (W), or an alloy thereof, but not limited thereto. The second gate electrode 230 may be disposed on the second gate insulating layer 220. For example, the second gate electrode 230 may overlap with the channel region 210c of the second semiconductor pattern 210. The second gate electrode 230 may be insulated from the second semiconductor pattern 210 by the second gate insulating layer 220. For example, a side of the second gate insulating layer 220 may be continuously with a side of the second gate electrode 230. The channel region 210c of the second semiconductor pattern 210 may have an electrical conductivity corresponding to a voltage applied to the second gate electrode 230. In this embodiment, the second thin film transistor T2 is formed by a top gate method, but the present disclosure is not limited thereto. For example, the second thin film transistor T2 may be a bottom gate type or a dual gate type.

The first gate electrode may include a same material as the second gate electrode 230. For example, the second gate electrode 230 may be formed simultaneously with the first gate electrode. A thickness of the first gate electrode may be the same as a thickness of the second gate electrode 230.

The second source electrode 240 may include a conductive material. For example, the second source electrode 240 may include a metal, such as aluminum (Al), chrome (Cr), copper (Cu), molybdenum (Mo), titanium (Ti), tungsten (W) or an alloy thereof, but not limited thereto. The second source electrode 240 may include a same material as the second gate electrode 230. For example, the second source electrode 240 may be formed simultaneously with the second gate electrode 230. The second source electrode 240 may be spaced apparat from the second gate electrode 230 in the horizontal direction. The second source electrode 240 may be electrically connected to the source region $210s$ of the second semiconductor pattern 210. For example, the second source electrode 240 may be in direct contact with the second semiconductor layer $212s$ of the source region $210s$ of the second semiconductor pattern 210.

The second drain electrode 250 may include a conductive material. For example, the second drain electrode 250 may include a metal, such as aluminum (Al), chrome (Cr), copper (Cu), molybdenum (Mo), titanium (Ti), tungsten (W) or an alloy thereof, but not limited thereto. The second drain electrode 250 may include a same material as the second gate electrode 230. For example, the second drain electrode 250 may be formed simultaneously with the second gate electrode 230. The second drain electrode 250 may be spaced apart from the second gate electrode 230 in the horizontal direction. The second drain electrode 250 may be electrically connected to the drain region $210d$ of the second semiconductor pattern 210. For example, the second drain electrode 250 may be in direct contact with the second semiconductor layer $212d$ of the drain region $210d$ of the second semiconductor pattern 210.

The first source electrode and the first drain electrode may include a same material as the second source electrode 240 and the second drain electrode 250. For example, the first source electrode and the first drain electrode may be formed simultaneously with the second source electrode 240 and the second drain electrode 250. A thickness of the first source electrode and a thickness of the first drain electrode may the same as a thickness of the second source electrode 240 and a thickness of the second drain electrode 250, respectively.

The third thin film transistor T3 may include a third semiconductor pattern, a third gate insulating layer, a third gate electrode, a third source electrode and a third drain electrode. The third thin film transistor T3 may be formed simultaneously with the second thin film transistor T2. For example, the third semiconductor pattern may be formed in a same structure as the second semiconductor pattern 210. The third gate electrode, the third source electrode and the third drain electrode may include a same material as the second gate electrode 230, the second source electrode 240 and the second drain electrode 250, respectively. The third thin film transistor T3 may reset the storage capacitor Cst according to the gate signal. For example, the third gate electrode may be electrically connected to the same gate line (e.g., $GL_i$ or $GL_{(i+1)}$ in FIG. 2) as the first gate electrode, the third source electrode may be electrically connected to one of the reference voltage supply lines (e.g., RL in FIG. 2), and the third drain electrode may be electrically connected to one electrode of the storage capacitor (e.g., Cst in FIG. 2).

The storage capacitor Cst may maintain a signal applied to the second gate electrode 230 of the second thin film transistor T2 for one frame. For example, the storage capacitor Cst may be electrically connected between the second gate electrode 230 and the second drain electrode 250 of the second thin film transistor T2. The storage capacitor Cst may have a stacked structure of capacitor electrodes. For example, the storage capacitor Cst may include a first capacitor electrode electrically connected to the second gate electrode 230 of the second thin film transistor T2 and a second capacitor electrode electrically connected to the second drain electrode 250 of the second thin film transistor T2. The third drain electrode of the third thin film transistor T3 may be connected to the same capacitor electrode as the second drain electrode 250 of the second thin film transistor T2. For example, the third drain electrode of the third thin film transistor T3 may be electrically connected to the second capacitor electrode of the storage capacitor Cst.

A plurality of insulating layers 110, 120, 130, 140 and 150 for preventing unnecessary electrical connection in each pixel area $PA_i$ and $PA_{(i+1)}$ may be disposed on the device substrate 100. For example, a device buffer layer 110, an interlayer insulating layer 120, a device passivation layer 130, a planarization layer 140 and a bank insulating layer 150 may be disposed on or above the device substrate 100, but exemplary embodiments of the present disclosure are not limited thereto, and other insulating layers not shown may be disposed on the device substrate 100 and some insulating layer may be omitted as necessary.

The device buffer layer 110 may be disposed close to the device substrate 100. The device buffer layer 110 may prevent or at least reduce pollution due to the device substrate 100 in a process of forming the pixel driving circuit DC of each pixel area $PA_i$ and $PA_{(i+1)}$. For example, an upper surface of the device substrate 100 toward the pixel driving circuit DC of each of the pixel areas $PA_i$ and $PA_{(i+1)}$ may be completely covered by the device buffer layer 110. The pixel driving circuit DC of each of the pixel areas $PA_i$ and $PA_{(i+1)}$ may be disposed on or above the device buffer layer 110. The device buffer layer 110 may include an insulating material. For example, the device buffer layer 110 may include an inorganic insulating material, such as silicon oxide (SiOx), silicon nitride (SiNx), silicon oxide nitride (SiONx), etc. The device buffer layer 110 may include a multi-layer structure. For example, the device buffer layer 110 may have a stacked structure of an inorganic insulating layer made of silicon oxide (SiOx), an inorganic insulating layer made of silicon nitride (SiNx) and silicon oxide nitride (SiONx).

At least one light-blocking pattern 105 may be disposed between the device substrate 100 and the device buffer layer 110 in each pixel area $PA_i$ and $PA_{(i+1)}$. The semiconductor patterns 210 of each of the pixel areas $PA_i$ and $PA_{(i+1)}$ may overlap with the light-blocking pattern 105 of the corresponding pixel area $PA_i$ and $PA_{(i+1)}$. The light-blocking pattern 105 may include a material capable of blocking light. For example, the light-blocking pattern 105 may include a metal, such as aluminum (Al), chrome (Cr), copper (Cu), molybdenum (Mo), titanium (Ti), tungsten (W) and an alloy thereof, etc. External light incident on the semiconductor patterns 210 of each of the pixel areas $PA_i$ and $PA_{(i+1)}$ may be blocked by the light-blocking pattern 105 in the corresponding pixel area $PA_i$ and $PA_{(i+1)}$. Thus, in the display apparatus according to the aspect of the present disclosure, changes in the characteristics of the thin film transistors T1, T2 and T3 in each of the pixel areas $PA_i$ and $PA_{(i+1)}$ due to the external light may be prevented or at least reduced.

A specific voltage may be applied to the light-blocking pattern 105 in each pixel area $PA_i$ and $PA_{(i+1)}$. For example, the light-blocking pattern 105 overlapping with the second semiconductor pattern 210 of each of the pixel areas $PA_i$ and $PA_{(i+1)}$ may be electrically connected to the second drain electrode 250 of the corresponding pixel area $PA_i$ and $PA_{(i+1)}$. Thus, in the display apparatus according to the aspect of the present disclosure, changes in the characteristics of the second thin film transistor T2 in each of the pixel areas $PA_i$ and $PA_{(i+1)}$ due to the external light may be effectively prevented or at least reduced.

Some of the signal wirings $GL_i$, $GL_{(i+1)}$, DL, PL and RL may include a same material as the light-blocking pattern 105 in each pixel area $P_A$ and $PA_{(i+1)}$. For example, some of the signal wirings $GL_i$, $GL_{(i+1)}$, DL, PL and RL may include a metal, such as aluminum (Al), chrome (Cr), copper (Cu), molybdenum (Mo), titanium (Ti), tungsten (W), or an alloy thereof, etc. For example, the data lines DL, the power voltage supply lines PL and the reference voltage supply lines RL may include a same material as the light-blocking pattern 105 in each pixel area $PA_i$ and $PA_{(i+1)}$. Alternatively, signal wirings DL, PL and RL may include different material from the light-blocking pattern 105 in each of pixel areas $PA_i$ and $PA_{(i+1)}$. The data lines DL, the power voltage supply lines PL and the reference voltage supply lines RL may be disposed on a same layer as the light-blocking pattern of each pixel area $PA_i$ and $PA_{(i+1)}$. For example, the data lines DL, the power voltage supply lines PL and the reference voltage supply lines RL may be formed simultaneously with the light-blocking pattern 105 in each pixel area $PA_1$ and $PA_{(i+1)}$ in the same process. The data lines DL, the power voltage supply lines PL and the reference voltage supply lines RL may extend in parallel.

The gate lines $GL_1$ and $GL_{(i+1)}$ may intersect the data lines DL, the power voltage supply lines PL and the reference voltage supply lines RL. The gate lines $GL_i$ and $GL_{(i+1)}$ may be disposed on a layer different from the data lines DL, the power voltage supply lines PL and the reference voltage supply lines RL. For example, the gate lines $GL_i$ and $GL_{(i+1)}$ may be disposed on a same layer as the second gate electrode 230 of each pixel area $PA_1$ and $PA_{(i+1)}$. The gate lines $GL_i$ and $GL_{(i+1)}$ may include a same material as the second gate electrode 230 of each pixel area $P_A$ and $PA_{(i+1)}$. For example, the gate lines $GL_i$ and $GL_{(i+1)}$ may include a metal, such as aluminum (Al), chrome (Cr), copper (Cu), molybdenum (Mo), titanium (Ti) and tungsten (W), or an alloy thereof, etc. For example, the gate lines $GL_i$ and $GL_{(i+1)}$ may be formed simultaneously with the second gate electrode 230 of each pixel area $PA_i$ and $PA_{(i+1)}$. Alternatively, the data lines DL, the power voltage supply lines PL and the reference voltage supply lines RL may be disposed on a same layer as, include a same material as and be formed simultaneously with the second gate electrode 230 of each pixel area $PA_i$ and $PA_{(i+1)}$, and the gate lines $GL_i$ and $GL_{(i+1)}$ may be disposed on a same layer as, include a same material as and be formed simultaneously with the light-blocking pattern 105 in each pixel area $P_A$ and $PA_{(i+1)}$. Thus, in the display apparatus according to the aspect of the present disclosure, a process of forming the signal wirings $GL_i$, $GL_{(i+1)}$, DL, PL and RL may be simplified.

The interlayer insulating layer 120 may be disposed on the semiconductor patterns 210 of each pixel area $PA_i$ and $PA_{(i+1)}$. The interlayer insulating layer 120 may include an insulating material. The source electrodes 240 and the drain electrodes 250 of each of the pixel areas $PA_i$ and $PA_{(i+1)}$ may be disposed on the interlayer insulating layer 120. For example, the interlayer insulating layer may be disposed on a same layer as the second gate insulating layer 220 of each pixel area $PA_i$ and $PA_{(i+1)}$. The interlayer insulating layer 120 may include a same material as the second gate insulating layer 220 of each pixel area $PA_i$ and $PA_{(i+1)}$. For example, the interlayer insulating layer 120 may include an inorganic insulating material, such as silicon oxide (SiOx), silicon nitride (SiNx), silicon oxide nitride (SiONx), etc. For example, the interlayer insulating layer 120 may be formed simultaneously with the second gate insulating layer 220 of each pixel area $PA_i$ and $PA_{(i+1)}$.

The device passivation layer 130 may be disposed on the interlayer insulating layer 120. The device passivation layer 130 may prevent or at least reduce damages of the pixel driving circuit DC in each of the pixel areas $PA_i$ and $PA_{(i+1)}$ due to foreign matters such as external moisture and impact. For example, the source electrodes 240 and the drain electrodes 250 of each of the pixel areas $PA_i$ and $PA_{(i+1)}$ may be covered by the device passivation layer 130. The device passivation layer 130 may include an insulating material. For example, the device passivation layer 130 may include an inorganic insulating material, such as silicon oxide (SiOx), silicon nitride (SiNx), silicon oxide nitride (SiONx), etc.

The planarization layer 140 may be disposed on the device passivation layer 130. The planarization layer 140 may remove a thickness difference due to the pixel driving circuit DC of each pixel area $PA_i$ and $PA_{(i+1)}$. For example, an upper surface of the planarization layer 140 may be a flat surface. The planarization layer 140 may include an insulating material. The planarization layer 140 may include a material different from the device passivation layer 130. For example, the planarization layer 140 may include an organic insulating material such as photo acryl, benzocyclobutene (BCB), acrylic resin, epoxy resin, polyimide, polyethylene, silicon oxycarbon (SiOC), or the like, but is not limited thereto.

The light-emitting device 300 of each of the pixel areas $PA_i$ and $PA_{(i+1)}$ may emit light displaying a specific color. For example, the light-emitting device 300 of each of the pixel areas $PA_i$ and $PA_{(i+1)}$ may have a stacked structure of a lower electrode 310, a light-emitting layer 320 and an upper electrode 330. The light-emitting device 300 of each of the pixel areas $PA_i$ and $PA_{(i+1)}$ may be disposed on the planarization layer 140 of the corresponding pixel area $PA_1$ and $PA_{(i+1)}$. For example, the lower electrode 310, the light-emitting layer 320 and the upper electrode 330 of the light-emitting device 300 in each of the pixel areas $PA_i$ and $PA_{(i+1)}$ may be sequentially stacked on the upper surface of the planarization layer 140 in the corresponding pixel area $PA_i$ and $PA_{(i+1)}$.

The lower electrode 310 may include a conductive material. The lower electrode 310 may include a material having a relatively high reflectivity. For example, the lower electrode 310 may be a metal, such as aluminum (Al) and silver (Ag), etc. The lower electrode 310 may have a multi-layer structure. For example, the lower electrode 310 may have a structure in which a reflective electrode made of a metal such as aluminum (Al) and silver (Ag), etc is disposed between transparent electrodes made of a transparent conductive material, such as ITO and IZO, indium tin zinc oxide (ITZO), or the like. The display apparatus according to the exemplary embodiment of the present disclosure may be top emission type or bottom emission type, the lower electrode 310 may be transparent conductive metal oxide, such as ITO (indium-tin-oxide), indium gallium oxide (IGO), IZO (indium-zinc-oxide), etc, if the display apparatus is bottom emission type.

The light-emitting layer 320 may generate light having luminance corresponding to a voltage difference between the lower electrode 310 and the upper electrode 330. For example, the light-emitting layer 320 may include an emission material layer (EML) having an emission material. The emission material may include an organic material, an inorganic material or a hybrid material. For example, the display apparatus according to the aspect of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the aspect of the present disclosure, the emission efficiency of the light-emitting layer 320 may be improved.

The upper electrode 330 may include a conductive material. The upper electrode 330 may include a material different from the lower electrode 310. A transmittance of the upper electrode 330 may be higher than a transmittance of the lower electrode 310. For example, the upper electrode 330 may be a translucent electrode in which metals such as Ag and Mg are thinly formed. Thus, in the display apparatus according to the aspect of the present disclosure, the light generated by the light-emitting layer 320 may be reciprocated between the lower electrode 310 and the upper electrode 330. That is, in the display apparatus according to the aspect of the present disclosure, the light generated by the light-emitting layer 320 may be amplified by the micro-cavity effect. The light amplified by the micro-cavity effect may be emitted outside through the upper electrode 330. Therefore, in the display apparatus according to the aspect of the present disclosure, light extraction efficiency may be improved.

The light-emitting device 300 of each of the pixel areas $PA_i$ and $PA_{(i+1)}$ may be electrically connected to the second thin film transistor T2 of the pixel driving circuit DC in the corresponding pixel area $PA_i$ and $PA_{(i+1)}$. For example, the second drain electrode 250 of each of the pixel areas $PA_i$ and $PA_{(i+1)}$ may be electrically connected to the lower electrode 310 of the corresponding pixel area $PA_i$ and $PA_{(i+1)}$. The lower electrode 310 of each of the pixel areas $PA_i$ and $PA_{(i+1)}$ may be electrically connected to the pixel driving circuit DC of the corresponding pixel areas $PA_i$ and $PA_{(i+1)}$ by a first repair wiring 410 and the like. For example, the device passivation layer 130 and the planarization layer 140 may include electrode contact holes overlapping with a portion of the first repair wiring 410 in each of the pixel areas $PA_i$ and $PA_{(i+1)}$. The lower electrode 310 of each of the pixel areas $PA_i$ and $PA_{(i+1)}$ may be electrically connected to the corresponding first repair wiring 410 through at least one of the electrode contact holes.

The first repair wiring 410 of each of the pixel areas $PA_i$ and $PA_{(i+1)}$ may be electrically connected to the second drain electrode 250 and the lower electrode 310 of the corresponding pixel area $PA_i$ and $PA_{(i+1)}$. The first repair wiring 410 of each of the pixel areas $PA_i$ and $PA_{(i+1)}$ may have a relative high transmittance. For example, the transmittance of the first repair wiring 410 in each of the pixel areas $PA_i$ and $PA_{(i+1)}$ may be higher than the transmittance of the lower electrode 310 in the corresponding pixel area $PA_1$ and $PA_{(i+1)}$.

The first repair wiring 410 of each of the pixel areas $PA_i$ and $PA_{(i+1)}$ may be formed by using a process of forming the pixel driving circuit DC in the corresponding pixel area $PA_1$ and $PA_{(i+1)}$. For example, the first repair wiring 410 of each of the pixel areas $PA_i$ and $PA_{(i+1)}$ may be formed by a process of forming the second semiconductor pattern 210 in the corresponding pixel area $PA_i$ and $PA_{(i+1)}$. The first repair wiring 410 of each of the pixel areas $PA_1$ and $PA_{(i+1)}$ may have a same structure as the second semiconductor pattern 210 of the corresponding pixel area $PA_i$ and $PA_{(i+1)}$. Thus, in the display apparatus according to the aspect of the present disclosure, a decrease of process efficiency due to a process of forming the first repair wiring 410 in each of the pixel areas $PA_i$ and $PA_{(i+1)}$ may be prevented or at least reduced.

The first repair wiring 410 of each of the pixel areas $PA_1$ and $PA_{(i+1)}$ may include a first lower wiring layer 411 and a first upper wiring layer 412. The first lower wiring layer 411 may be disposed on a same layer as the first semiconductor layer 211*s* and 211*d*. The first lower wiring layer 411 may include a same material as the first semiconductor layer 211*s* and 211*d*. For example, the first lower wiring layer 411 may be formed simultaneously with the first semiconductor layer 211*s* and 211*d*. The first lower wiring layer 411 may include an oxide semiconductor, such as IGZO (indium-gallium-zinc-oxide), ITZO (indium tin zinc oxide), ITGZO (indium tin gallium zinc oxide), etc. The first lower wiring layer 411 may have a same resistivity as the first semiconductor layer 211*s* and 211*d*. For example, the first lower wiring layer 411 may be a region of an oxide semiconductor, which is not conductivity.

The first upper wiring layer 412 may be disposed on the first lower wiring layer 411. For example, the first lower wiring layer 411 may be disposed between the device substrate 100 and the first upper wiring layer 412. The first upper wiring layer 412 may be disposed on a same layer as the second semiconductor layer 212*s* and 212*d*. The first upper wiring layer 412 may include a same material as the second semiconductor layer 212*s* and 212*d*. For example, the first upper wiring layer 412 may include a transparent conductive metal oxide, such as ITO (indium-tin-oxide), indium gallium oxide (IGO), and IZO (indium-zinc-oxide), etc. The first upper wiring layer 412 may be formed simultaneously with the second semiconductor layer 212*s* and 212*d*. The first upper wiring layer 412 may have a same resistivity as the second semiconductor layer 212*s* and 212*d*. For example, a resistance of the first upper wiring layer 412 may be lower than a resistance of the first lower wiring layer 411. Thus, in the display apparatus according to the aspect of the present disclosure, delay, loss and distortion of signal due to the first repair wiring 410 of each of the pixel areas $PA_i$ and $PA_{(i+1)}$ may be prevented or at least reduced.

The first repair wiring 410 of each of the pixel areas $PA_1$ and $PA_{(i+1)}$ may cross or overlap a repair cutting region $CA_i$ and $CA_{(i+1)}$ in the corresponding pixel area $PA_i$ and $PA_{(i+1)}$. The first upper wiring layer 412 of each of the pixel areas $PA_i$ and $PA_{(i+1)}$ may be disposed outside the repair cutting region $CA_i$ and $CA_{(i+1)}$ in the corresponding pixel area $PA_i$ and $PA_{(i+1)}$. For example, only the first lower wiring layer 411 of the first repair wiring 410 in each of the pixel areas $PA_i$ and $PA_{(i+1)}$ may be disposed on the repair cutting region $CA_i$ and $CA_{(i+1)}$ of the corresponding pixel area $PA_i$ and $PA_{(i+1)}$. The interlayer insulating layer 120 disposed on the repair cutting region $CA_i$ and $CA_{(i+1)}$ of each of the pixel areas $PA_i$ and $PA_{(i+1)}$ may be in direct contact with the first lower wiring layer 411 of the first repair wiring 410 of the corresponding pixel area $PA_i$ and $PA_{(i+1)}$.

The second drain electrode 250 of each of the pixel areas $PA_i$ and $PA_{(i+1)}$ may be electrically connected to the lower electrode 310 through the first upper wiring layer 412 of the first repair wiring 410 in the corresponding pixel area $PA_i$ and $PA_{(i+1)}$. For example, the repair cutting region $CA_i$ and $CA_{(i+1)}$ of each of the pixel areas $PA_i$ and $PA_{(i+1)}$ may be disposed outside the pixel driving circuit DC of the corresponding pixel area $PA_i$ and $PA_{(i+1)}$. The second drain electrode 250 of each of the pixel areas $PA_i$ and $PA_{(i+1)}$ may be in direct contact with the first upper wiring layer 412 of the first repair wiring 410 in the corresponding pixel area $PA_i$ and $PA_{(i+1)}$. Thus, in the display apparatus according to the aspect of the present disclosure, a contact resistance between the second drain electrode 250 and the first repair wiring 410 in each of the pixel areas $PA_i$ and $PA_{(i+1)}$ may be minimized or reduced. Therefore, in the display apparatus according to the aspect of the present disclosure, delay, loss and distortion of signal between the second drain electrode 250 and the first repair wiring 410 in each of the pixel areas $PA_i$ and $PA_{(i+1)}$ may be prevented or at least reduced.

A dummy wiring 510 and 520 may be disposed between the first repair wiring 410 and the lower electrode 310 in each pixel area $P_A$ and $PA_{(i+1)}$. For example, the dummy wiring 510 and 520 of each of the pixel areas $PA_i$ and $PA_{(i+1)}$ may be in direct contact with a portion of the first repair wiring 410 and a portion of the lower electrode 310, which overlap with the electrode contact hole of the corresponding pixel area $PA_i$ and $PA_{(i+1)}$. The lower electrode 310 of each of the pixel areas $PA_i$ and $PA_{(i+1)}$ may be connected to the corresponding first repair wiring 410 through the dummy wiring 510 and 520 of the corresponding pixel area $PA_i$ and $PA_{(i+1)}$.

The dummy wiring 510 and 520 of each pixel area $P_A$ and $PA_{(i+1)}$ may include a conductive material. The dummy wiring 510 and 520 of each of the pixel areas $PA_i$ and $PA_{(i+1)}$ may be disposed between the interlayer insulating layer 120 and the device passivation layer 130 in the corresponding pixel area $PA_i$ and $PA_{(i+1)}$. For example, the dummy wiring 510 and 520 of each of the pixel areas $PA_i$ and $PA_{(i+1)}$ may be disposed on a same layer as the second gate electrode 230, the second source electrode 240 and the second drain electrode 250 of the corresponding pixel area $PA_i$ and $PA_{(i+1)}$. The dummy wiring 510 and 520 of each of the pixel areas $PA_i$ and $PA_{(i+1)}$ may include a same material as the second gate electrode 230, the second source electrode 240 and the second drain electrode 250 of the corresponding pixel area $PA_1$ and $PA_{(i+1)}$. For example, the dummy wiring 510 and 520 of each of pixel areas $PA_i$ and $PA_{(i+1)}$ may include a metal, such as aluminum (Al), chrome (Cr), copper (Cu), molybdenum (Mo), titanium (Ti) and tungsten (W), etc. For example, the dummy wiring 510 and 520 of each of the pixel areas $PA_1$ and $PA_{(i+1)}$ may be formed simultaneously with the second gate electrode 230, the second source electrode 240 and the second drain electrode 250 of the corresponding pixel area $PA_i$ and $PA_{(i+1)}$.

The bank insulating layer 150 may be disposed on the planarization layer 140. The bank insulating layer 150 may define an emission area in each pixel area $PA_i$ and $PA_{(i+1)}$. For example, the bank insulating layer 150 may cover an edge of the lower electrode 310 in each pixel area $PA_1$ and $PA_{(i+1)}$. The light-emitting layer 320 and the upper electrode 330 of each pixel area $PA_1$ and $PA_{(i+1)}$ may be sequentially stacked on the portion of the corresponding lower electrode 310 exposed by the bank insulating layer 150. The bank insulating layer 150 may include an insulating material. For example, the bank insulating layer 150 may be an organic insulating layer including an organic insulating material such as photo acryl, benzocyclobutene (BCB), acrylic resin, epoxy resin, polyimide, polyethylene, silicon oxycarbon (SiOC), or the like, but is not limited thereto. The bank insulating layer 150 may include a material different from the planarization layer 140. The lower electrode 310 of each of the pixel areas $PA_1$ and $PA_{(i+1)}$ may be insulated from the lower electrode 310 of adjacent pixel areas $PA_1$ and $PA_{(i+1)}$ by the bank insulating layer 150.

A voltage applied to the upper electrode 330 of each of the pixel areas $PA_i$ and $PA_{(i+1)}$ may be the same as a voltage applied to the upper electrode 330 of adjacent pixel area $PA_1$ and $PA_{(i+1)}$. For example, the upper electrode 330 of each of the pixel areas $PA_1$ and $PA_{(i+1)}$ may be electrically connected to the upper electrode 330 of adjacent pixel area $PA_1$ and $PA_{(i+1)}$. The upper electrode 330 of each of the pixel areas $PA_i$ and $PA_{(i+1)}$ may include a same material as the upper electrode 330 of adjacent pixel area $PA_1$ and $PA_{(i+1)}$. For example, the upper electrode 330 of each of the pixel areas $PA_i$ and $PA_{(i+1)}$ may be formed simultaneously with the upper electrode 330 of adjacent pixel area $PA_1$ and $PA_{(i+1)}$. The upper electrode 330 of each of the pixel areas $PA_i$ and $PA_{(i+1)}$ may be in direct contact with the upper electrode 330 of adjacent pixel area $PA_i$ and $PA_{(i+1)}$. For example, the upper electrode 330 of each of the pixel areas $PA_i$ and $PA_{(i+1)}$ may extend on the bank insulating layer 150. The bank insulating layer 150 may be covered by the upper electrode 330. Thus, in the display apparatus according to the aspect of the present disclosure, a process of forming the upper electrode 330 in each of the pixel areas $PA_i$ and $PA_{(i+1)}$ may be simplified. And, in the display apparatus according to the aspect of the present disclosure, the luminance of the light emitted from the light-emitting device 300 of each of the pixel areas $PA_i$ and $PA_{(i+1)}$ may be adjusted by the data signal applied to the pixel driving circuit DC of the corresponding pixel area $PA_i$ and $PA_{(i+1)}$.

An encapsulation unit 600 may be disposed on the light-emitting device 300 of each pixel area $PA_i$ and $PA_{(i+1)}$. The encapsulation unit 600 may prevent or at least reduce damages of the light-emitting devices 300 due to foreign matters such as external moisture and impact. The encapsulation unit 600 may have a multi-layer structure. For example, the encapsulation unit 600 may include a first encapsulating layer 610, a second encapsulating layer 620 and a third encapsulating layer 630, which are sequentially stacked. The first encapsulating layer 610, the second encapsulating layer 620 and the third encapsulating layer 630 may include an insulating material. The second encapsulating layer 620 may include a material different from the first encapsulating layer 610 and the third encapsulating layer 630. For example, the first encapsulating layer 610 and the third encapsulating layer 630 may be an inorganic insulating material, such as silicon nitride (SiNx), silicon oxide (SiOx), silicon oxide nitride (SiONx), etc, and the second encapsulating layer 620 may include an organic insulating material such as photo acryl, benzocyclobutene (BCB), acrylic resin, epoxy resin, polyimide, polyethylene, silicon oxycarbon (SiOC), or the like, but is not limited thereto. Thus, in the display apparatus according to the aspect of the present disclosure, the damages of the light-emitting devices 300 due to foreign matters such as external moisture and impact may be effectively prevented or at least reduced.

A repair connecting region WA may be disposed in one of adjacent two pixel areas $PA_i$ and $PA_{(i+1)}$ in the first direction. For example, the repair connecting region WA may be disposed in the (i+1)-th pixel area $PA_{(i+1)}$. The dummy wiring 520 of the (i+1)-th pixel area $PA_{(i+1)}$ may extend on the repair connecting region WA. For example, the dummy wiring 520 in the (i+1)-th pixel area $PA_{(i+1)}$ may include an end overlapping with the repair connecting region WA. The lower electrode 310 of the (i+1)-th pixel area $PA_{(i+1)}$ may be in direct contact with the dummy wiring 520 of the (i+1)-th pixel area $PA_{(i+1)}$ between the repair cutting region $CA_{(i+1)}$ and the repair connecting region WA in the (i+1)-th pixel area $PA_{(i+1)}$. For example, via the dummy wiring 520 of the (i+1)-th pixel area $PA_{(i+1)}$, the lower electrode 310 of the (i+1)-th pixel area $PA_{(i+1)}$ may be electrically connected to the pixel driving circuit DC of the (i+1)-th pixel area $PA_{(i+1)}$ through the first repair wiring 410 of the (i+1)-th pixel area $PA_{(i+1)}$ between the repair cutting region $CA_{(i+1)}$ and the repair connecting region WA in the (i+1)-th pixel area $PA_{(i+1)}$.

A second repair wiring 420 may be disposed in the (i+1)-th pixel area $PA_{(i+1)}$. The second repair wiring 420 may have a relative high transmittance. For example, the second repair wiring 420 may have a transmittance higher than the lower electrode 310 of the (i+1)-th pixel area $PA_{(i+1)}$. The second repair wiring 420 may be formed by using a process of forming the pixel driving circuit DC in the (i+1)-th pixel area $PA_{(i+1)}$. For example, the second repair wiring 420 may be formed by using a process of forming the second semiconductor pattern 210 in the (i+1)-th pixel area $PA_{(i+1)}$. The second repair wiring 420 may be formed simultaneously with the first repair wiring 410 of each pixel area $PA_i$ and $PA_{(i+1)}$. The second repair wiring 420 may have a same structure as the first repair wiring 410 of each pixel area $PA_i$ and $PA_{(i+1)}$. For example, the second repair wiring 420 may have a stacked structure of a second lower wiring layer 421 and a second upper wiring layer 422.

The second lower wiring layer 421 may be disposed on a same layer as the first lower wiring layer 411. The second lower wiring layer 421 may include a same material as the first lower wiring layer 411. For example, the second lower wiring layer 421 may include an oxide semiconductor, such as IGZO (indium-gallium-zinc-oxide), ITZO (indium tin zinc oxide), ITGZO (indium tin gallium zinc oxide), etc. The second lower wiring layer 421 may be formed simultaneously with the first lower wiring layer 411. The second lower wiring layer 421 may have a same resistivity as the first lower wiring layer 411. For example, the second lower wiring layer 421 may be a region of an oxide semiconductor, which is not conductive.

The second upper wiring layer 422 may be disposed on a same layer as the first upper wiring layer 412. For example, the second lower wiring layer 421 may be disposed between the device substrate 100 and the second upper wiring layer 422. The second upper wiring layer 422 may include a same material as the first upper wiring layer 412. For example, the second upper wiring layer 422 may include a transparent conductive metal oxide, such as ITO (indium-tin-oxide), indium gallium oxide (IGO), and IZO (indium-zinc-oxide), etc. The second upper wiring layer 422 may be formed simultaneously with the first upper wiring layer 412. The second upper wiring layer 422 may have a same resistivity as the first upper wiring layer 412. For example, the second upper wiring layer 422 may have a resistivity lower than the second lower wiring layer 421. Thus, in the display apparatus according to the aspect of the present disclosure, delay, loss and distortion of signal transmitted through the second repair wiring 420 may be prevented or at least reduced.

The second upper wiring layer 422 may extend parallel to the second lower wiring layer 421. For example, a lower surface of the second upper wiring layer 422 toward the device substrate 100 may completely cover an upper surface of the second lower wiring layer 421 opposite to the device substrate 100. The second repair wiring 420 may extend on the repair connecting region WA. The second lower wiring layer 421 and the second upper wiring layer 422 of the second repair wiring 420 may include a region overlapping with the repair connecting region WA. For example, the second lower wiring layer 421 and the second upper wiring layer 422 of the second repair wiring 420 may be stacked between the device substrate 100 and a portion of the dummy wiring 520 of the (i+1)-th pixel area $PA_{(i+1)}$, which overlap with the repair connecting region WA. The dummy wiring 520 of the (i+1)-th pixel area $PA_{(i+1)}$ may be insulated from the second repair wiring 420 by the interlayer insulating layer 120. For example, the interlayer insulating layer 120 may extend between the second upper wiring layer 422 of the second repair wiring 420 and the dummy wiring 520 of the (i+1)-th pixel area $PA_{(i+1)}$ in the repair connecting region WA.

The second repair wiring 420 may extend beyond the (i+1)-th pixel area $PA_{(i+1)}$. The second repair wiring 420 may extend in the first direction. For example, the second repair wiring 420 may extend on the i-th pixel area $PA_i$. The second repair wiring 420 may be electrically connected to the first repair wiring 410 of the i-th pixel area $PA_i$. For example, the second repair wiring 420 may be in direct contact with the first repair wiring 410 of the i-th pixel area $PA_i$. The second lower wiring layer 421 of the second repair wiring 420 may be in direct contact with the first lower wiring layer 411 of the first repair wiring 410 in the i-th pixel area $PA_i$. The second upper wiring layer 422 of the second repair wiring 420 may be in direct contact with the first upper wiring layer 412 of the first repair wiring 410 in the i-th pixel area $PA_i$. A boundary surface between the second lower wiring layer 421 and the first lower wiring layer 411 of the i-th pixel area $PA_i$ and a boundary surface between the second upper wiring layer 422 and the first upper wiring layer 412 of the i-th pixel area $PA_i$ may be not recognized. Thus, in the display apparatus according to the aspect of the present disclosure, the lower electrode 310 of the i-th pixel area $PA_i$ may be selectively connected to the pixel driving circuit DC of the (i+1)-th pixel area $PA_{(i+1)}$ by the second repair wiring 420, as detailed later.

Figure 6:
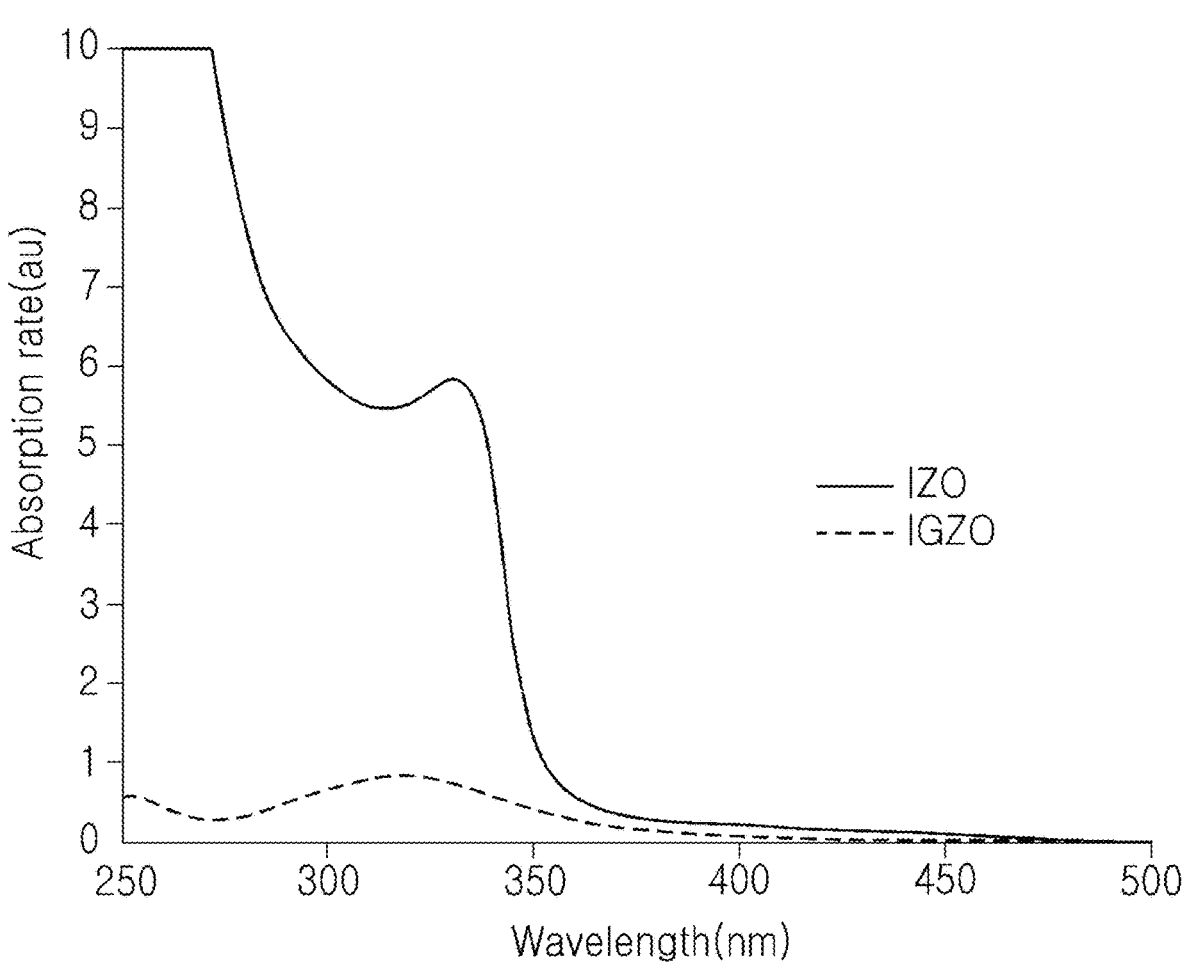
FIG. 6 is a graph showing energy absorption rates of a layer made of IGZO which is an oxide semiconductor and a layer made of IZO which is a conductive metal oxide according to a wavelength.

FIG. 6 is a graph showing energy absorption rates of a layer made of IGZO which is an oxide semiconductor and a layer made of IZO which is a conductive metal oxide according to a wavelength.

Referring to FIG. 6, the layer made of IZO which is a conductive metal oxide may have an energy absorption rate higher than the layer made of IGZO which is an oxide semiconductor, with respect to light having a wavelength of 250 nm to 350 nm. That is, in the display apparatus according to the aspect of the present disclosure, the first upper wiring layer 412 and the second upper wiring layer 422 may have an energy absorption rate higher than the first lower wiring layer 411 and the second lower wiring layer 421. Thus, in the display apparatus according to the aspect of the present disclosure, when a short-wavelength laser is irradiated on the first repair wiring 410 and the second repair wiring 420, a region in which only the lower wiring layers 411 and 421 is disposed may be removed by the irradiated laser, whereas the upper wiring layer 412 and 422 disposed in a region in which the lower wiring layer 411 and 421 and the upper wiring layer 412 and 422 are stacked may be deformed by an energy of the irradiated laser. For example, in the display apparatus according to the aspect of the present disclosure, a process of removing a portion of the first repair wiring 410 overlapping with the repair cutting area $CA_i$ of the i-th pixel area $PA_i$ and a process of electrically connecting the second repair wiring 420 to the dummy wiring 520 in the (i+1)-th pixel area $PA_{(i+1)}$ by deforming a portion of the second repair wiring 420 overlapping with the repair connecting area WA may be simultaneously performed by irradiating the laser having a same wavelength on the repair cutting area $CA_i$ of the i-th pixel area $PA_i$ and the repair connecting area WA in the (i+1)-th pixel area $PA_{(i+1)}$.

Figure 7:
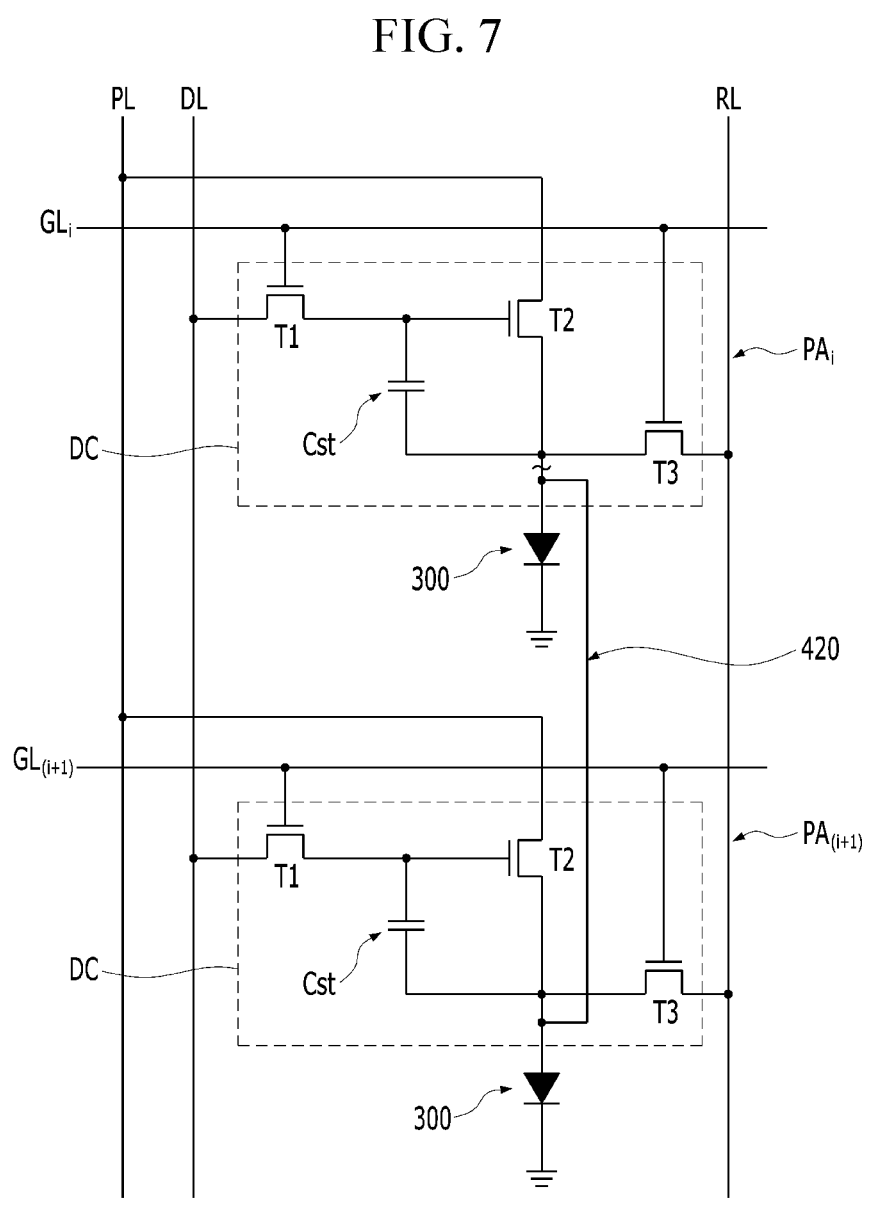
Figures 8, 9:
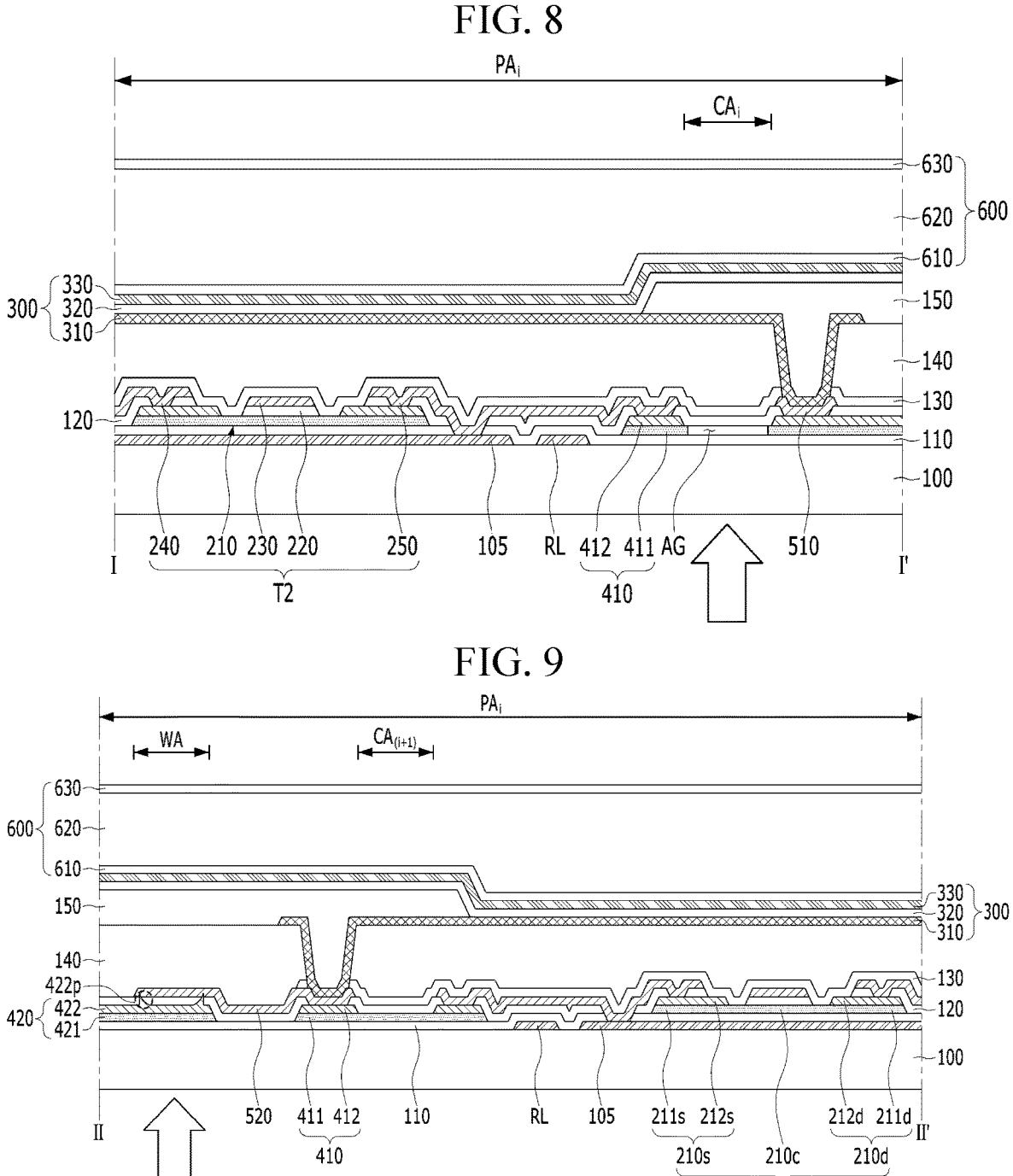

FIGS. 7, 8 and 9 are views for explaining a repair process in the display apparatus according to the aspect of the present disclosure.

Referring to FIGS. 7 and 8, in the display apparatus according to the aspect of the present disclosure, the first lower wiring layer 411 of the first repair wiring 410 overlapping with the repair cutting area $CA_i$ of the i-th pixel area $PA_i$ may be removed by a laser irradiated on the repair cutting area $CA_i$ of the i-th pixel area $PA_i$. That is, in the display apparatus according to the aspect of the present disclosure, an air-gap AG may be formed by the irradiation of the laser, and the electrical connection between the lower electrode 310 of the i-th pixel area $PA_i$ and the second drain electrode 250 of the i-th pixel area $PA_i$ may be broken. The laser may be a picosecond laser or a femtosecond laser, but is not limited thereto. A laser uses light that is induced and emitted through amplifying light generated by applying energy to a specific material.

Referring to FIGS. 7 and 9, in the display apparatus according to the aspect of the present disclosure, a wiring tip 422$p$ protruding upward may be formed at the second upper wiring layer 422 of the second repair wiring 420 overlapping with the repair connecting region WA by a laser irradiated on the repair connecting region WA of the (i+1)-th pixel area $PA_{(i+1)}$, and the wiring tip 422$p$ of the second upper wiring layer 422 may be in direct contact with the dummy wiring 520 of the (i+1)-th pixel area $PA_{(i+1)}$ overlapping with the repair connecting region WA by penetrating the interlayer insulating layer 120. That is, in the display apparatus according to the aspect of the present disclosure, the lower electrode 310 of the i-th pixel area $PA_i$ may be electrically connected to the second drain electrode 250 of the (i+1)-th pixel area $PA_{(i+1)}$ by the second repair wiring 420 including the wiring tip 422$p$.

Accordingly, the display apparatus according to the aspect of the present disclosure may include the first repair wiring 410 separately disposed in each of the pixel areas $PA_i$ and $PA_{(i+1)}$ and the second repair wiring 420 extending through adjacent pixel areas $PA_i$ and $PA_{(i+1)}$ in the first direction, wherein the first repair wiring 410 in each of the pixel areas $PA_i$ and $PA_{(i+1)}$ may include the first lower wiring layer 411 crossing or overlapping the repair cutting region $CA_i$ and $CA_{(i+1)}$ of the corresponding pixel areas $PA_i$ and $PA_{(i+1)}$ and the first upper wiring layer 412 disposed outside the repair cutting region $CA_i$ and $CA_{(i+1)}$ in the corresponding pixel area $PA_i$ and $PA_{(i+1)}$, wherein the second repair wiring 420 may have a stacked structure of the second lower wiring layer 421 disposed between the device substrate 100 and the corresponding dummy wiring 520 in the repair connecting region WA and the second upper wiring layer 422, and wherein the first lower wiring layer 411, the second lower wiring layer 421, the first upper wiring layer 412 and the second upper wiring layer 422 may have a transmittance higher than the lower electrode 310 of each pixel area $PA_i$ and $PA_{(i+1)}$. Thus, in the display apparatus according to the aspect of the present disclosure, a decrease in an aperture ratio and a transmittance due to the first repair wiring 410 and the second repair wiring 420 in each of the pixel areas $PA_i$ and $PA_{(i+1)}$ may be prevented or at least reduced, and a repair process using the first repair wiring 410 and the second repair wiring 420 of each of the pixel areas $PA_i$ and $PA_{(i+1)}$ may be simplified. Therefore, in the display apparatus according to the aspect of the present disclosure, a decrease in the aperture ratio and the transmittance due to the repair process may be prevented or at least reduced, and the process efficiency may be improved. And, in the display apparatus according to the aspect of the present disclosure, production energy may be reduced by process optimization.

Figure 10:
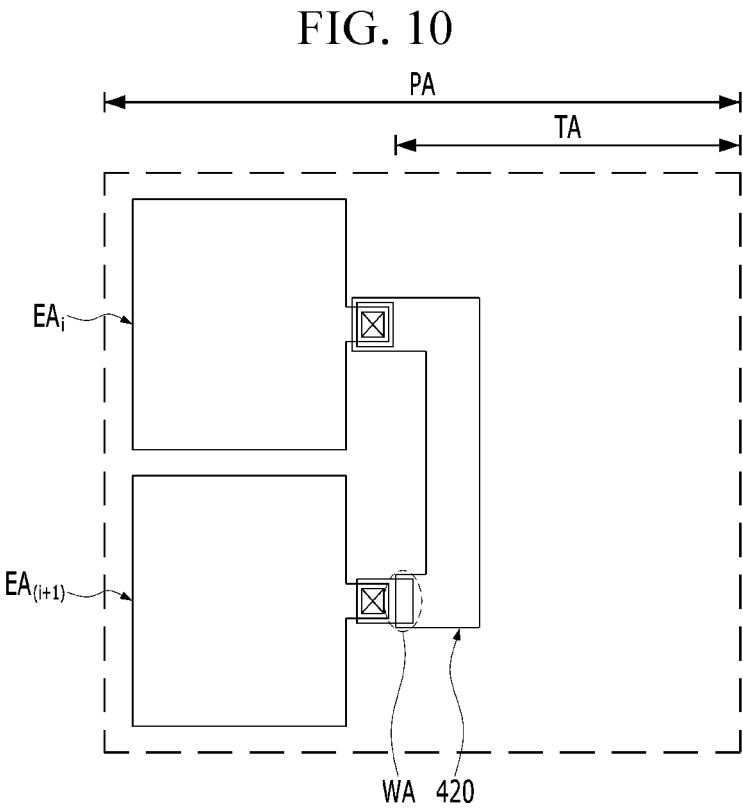

In the display apparatus according to another aspect of the present disclosure, each of the pixel area PA may include an emission area $EA_i$ and $EA_{(i+1)}$ and a transmissive area TA, as shown in FIG. 10. The emission area $EA_i$ and $EA_{(i+1)}$ may be defined by the bank insulating layer. The transmissive area TA may be disposed side by side with the emission area $EA_i$ and $EA_{(i+1)}$. For example, the transmissive area TA of each pixel area PA may be connected to the transmissive area TA of adjacent pixel area PA in the first direction. For example, the display apparatus according to another aspect of the present disclosure may be a transparent display apparatus recognized as glass, when the image is not realized. In the display apparatus according to another aspect of the present disclosure, at least a portion of the second repair wiring 420 may be disposed on the transmissive area TA. Thus, in the display apparatus according to another aspect of the present disclosure, an arrangement area of the second repair wiring 420 for a repair process of adjacent two emission areas $EA_i$ and $EA_{(i+1)}$ may be sufficiently secured, without a decrease in the transmittance of the transmissive area TA. That is, in the display apparatus according to another aspect of the present disclosure, the repair process may be performed, without a decrease in the aperture ratio and the transmittance. Therefore, in the display apparatus according to another aspect of the present disclosure, the process efficiency may be improved.

Figure 11:
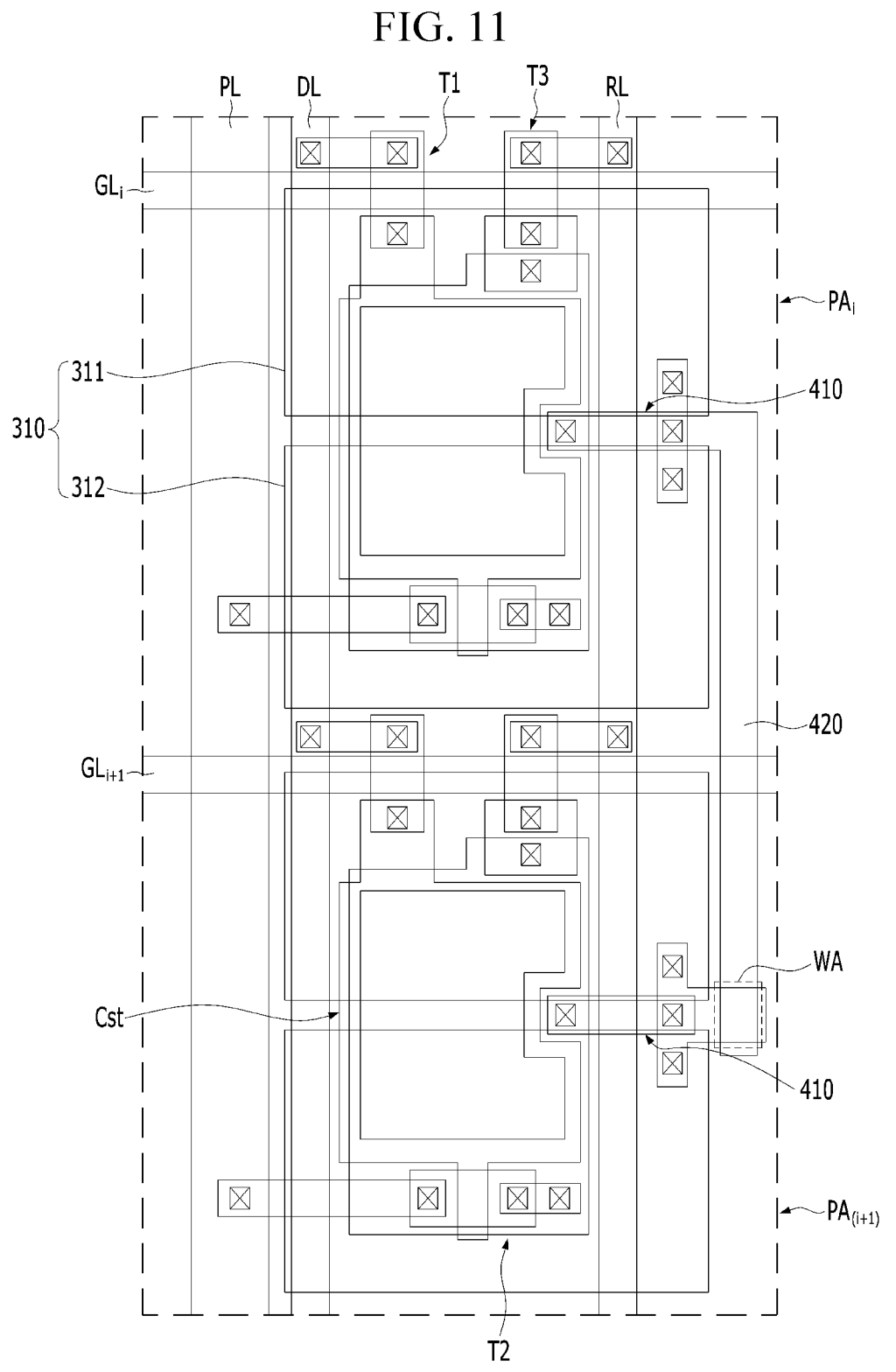

In the display apparatus according to another aspect of the present disclosure, the lower electrode 310 of each of the pixel areas $PA_i$ and $PA_{(i+1)}$ may be separated into a plurality of regions. For example, in the display apparatus according to another aspect of the present disclosure, the lower electrode 310 of each of the pixel areas $PA_i$ and $PA_{(i+1)}$ may be divided into a first electrode region 311 and a second electrode region 312, as shown in FIG. 11. The first electrode region 311 and the second electrode region 312 of each of the pixel areas $PA_i$ and $PA_{(i+1)}$ may be connected to the first repair wiring 410 or the dummy wiring in the corresponding pixel area $PA_i$ and $PA_{(i+1)}$. Thus, in the display apparatus according to another aspect of the present disclosure, when a defect occurs in the first electrode region 310 of the lower electrode 311 in each pixel area $PA_i$ and $PA_{(i+1)}$, the second electrode region 312 of the corresponding pixel areas $PA_i$ and $PA_{(i+1)}$ may be normally operated by broking only the electrical connection between the pixel driving circuit DC of the corresponding pixel areas $PA_i$ and $PA_{(i+1)}$ and the corresponding first electrode region 311. Therefore, in the display apparatus according to another aspect of the present disclosure, a degree of freedom in shape and configuration of the lower electrode 310 in each of the pixel areas $PA_i$ and $PA_{(i+1)}$ may be improved.

In the result, the display apparatus according to the aspects of the present disclosure may comprise the first repair wiring and the second repair wiring having a relative high transmittance, wherein the first repair wiring in each pixel area may include the first lower wiring layer crossing or overlapping with the repair cutting region of the corresponding pixel area and the first upper wiring layer disposed outside the repair cutting region, wherein the second repair wiring extending beyond each pixel area may include the second lower wiring layer and the second upper wiring layer, which are stacked between the device substrate and the dummy wiring in the repair connecting region disposed outside the corresponding pixel area, and wherein each of the first upper wiring layer and the second upper wiring layer may have an energy absorption rate higher than the first lower wiring layer and the second lower wiring layer. Thus, in the display apparatus according to the aspects of the present disclosure, a decrease in the aperture ratio due to the first repair wiring and the second repair wiring may be prevented or at least reduced. And, in the display apparatus according to the aspects of the present disclosure, a process of removing a portion of the first repair wiring overlapping with the repair cutting area and a process of electrically connecting the second repair wiring to the dummy wiring in the repair connecting region may be simultaneously performed. Thereby, in the display apparatus according to the aspects of the present disclosure, a decrease in the process efficiency due to the repair process using the first repair wiring and the second repair wiring may be minimized or reduced. That is, in the display apparatus according to the aspects of the present disclosure, the production energy may be reduced by process optimization. Further, in the display apparatus according to the aspects of the present disclosure, an overall aperture ratio may be increased by the first repair wiring and the second repair wiring having a relative high transmittance, and low power driving may be possible.

It will be apparent to those skilled in the art that various modifications and variations can be made in the display apparatus having the repair wiring of the present disclosure without departing from the spirit or scope of the aspects. Thus, it is intended that the present disclosure covers the modifications and variations of the aspects provided they come within the scope of the appended claims and their equivalents.

What is claimed is:

1. A display apparatus comprising:
a pixel driving circuit disposed on a pixel area of a device substrate;
a first repair wiring electrically connected to the pixel driving circuit, the first repair wiring overlapping with a repair cutting region of the pixel area;
a dummy wiring electrically connected to the first repair wiring, the dummy wiring including a region overlapping with a repair connecting region of the pixel area;
a second repair wiring disposed between the device substrate and the dummy wiring in the repair connecting region, the second repair wiring extending beyond the pixel area; and
a light-emitting device electrically connected to the dummy wiring, the light-emitting device having a stacked structure of a lower electrode, a light-emitting layer and an upper electrode,
wherein each of the first repair wiring and the second repair wiring has a stacked structure of a lower wiring layer and an upper wiring layer,
wherein the upper wiring layer has an energy absorption rate higher than the lower wiring layer, and
wherein the upper wiring layer of the first repair wiring is disposed outside the repair cutting region.

2. The display apparatus according to claim 1,
wherein the lower wiring layer and the upper wiring layer have a transmittance higher than the lower electrode.

3. The display apparatus according to claim 1, wherein the pixel area includes an emission area and a transmissive area, the transmissive area is connected to a transmissive area of an adjacent pixel area, and at least a portion of the second repair wiring is disposed on the transmissive area.

4. The display apparatus according to claim 1, wherein the lower electrode is separated into a plurality of regions, which are connected to the first repair wiring or the dummy wiring.

5. The display apparatus according to claim 1, wherein the lower electrode of the light-emitting device is connected to the dummy wiring between the repair cutting region and the repair connecting region.

6. The display apparatus according to claim 1, wherein the pixel driving circuit includes at least one thin film transistor,
wherein the at least one thin film transistor includes a semiconductor pattern, and
wherein the lower wiring layer includes a same material as a channel region of the semiconductor pattern.

7. The display apparatus according to claim 6, wherein the lower wiring layer and the channel region of the semiconductor pattern include an oxide semiconductor.

8. The display apparatus according to claim 6, wherein a source region and a drain region of the semiconductor pattern respectively includes a first semiconductor layer including a same material as the channel region, and a second semiconductor layer on the first semiconductor layer, and
wherein the upper wiring layer includes a same material as the second semiconductor layer.

9. The display apparatus according to claim 8, further comprising an interlayer insulating layer covering the semiconductor pattern,
wherein the interlayer insulating layer extends between the second repair wiring and the dummy wiring in the repair connecting region.

10. The display apparatus according to claim 6, wherein the thin film transistor includes a gate electrode disposed on the channel region of the semiconductor pattern, and
wherein the dummy wiring includes a same material as the gate electrode.

11. The display apparatus according to claim 10, wherein the dummy wiring includes a region disposed between the upper wiring layer of the first repair wiring and the lower electrode of the light-emitting device.

12. The display apparatus according to claim 8, wherein the first semiconductor layer is in direct contact with the second semiconductor layer in the source region of the semiconductor pattern.

13. The display apparatus according to claim 1, wherein the upper wiring layer has a lower resistivity than the lower wiring layer.

14. A display apparatus comprising:
a pixel driving circuit disposed on a first pixel area of a device substrate;
a first light-emitting device disposed on the first pixel area, the first light-emitting device having a stacked structure a first lower electrode, a first light-emitting layer and a first upper electrode;
a second light-emitting device disposed on a second pixel area of the device substrate, the second light-emitting device having a stacked structure of a second lower electrode, a second light-emitting layer and a second upper electrode;
a first repair wiring electrically connected to the pixel driving circuit and the first lower electrode of the first light-emitting device;
a dummy wiring electrically connected to the second lower electrode of the second light-emitting device, the dummy wiring extending on a repair connecting region of the second pixel area; and
a second repair wiring electrically connected to the first repair wiring, the second repair wiring extending on the second pixel area,
wherein the first repair wiring includes a first lower wiring layer overlapping with a repair cutting region of the first pixel area and a first upper wiring layer disposed outside the repair cutting region, wherein the second repair wiring includes a second lower wiring layer and a second upper wiring layer, which are stacked between the device substrate and the dummy wiring of the repair connecting region, wherein the first repair wiring and the second repair wiring have a transmittance higher than the first lower electrode and the second lower electrode, and wherein each of the first upper wiring layer and the second upper wiring layer has an energy absorption rate higher than the first lower wiring layer and the second lower wiring layer.

15. The display apparatus according to claim 14, wherein the first repair wiring and the second repair wiring have a transmittance higher than the first lower electrode and the second lower electrode.

16. The display apparatus according to claim 14, wherein the first upper wiring layer and the second upper wiring layer have a resistivity lower than the first lower wiring layer and the second lower wiring layer.

17. The display apparatus according to claim 14, wherein the second lower wiring layer includes a same material as the first lower wiring layer, and the second upper wiring layer includes a same material as the first upper wiring layer.

18. The display apparatus according to claim 17, wherein the second lower wiring layer is in contact with the first lower wiring layer, and the second upper wiring layer is in contact with the first upper wiring layer.

19. The display apparatus according to claim 14, wherein the pixel driving circuit includes at least one thin film transistor, and wherein a drain electrode of the at least one thin film transistor is connected to the first upper wiring layer of the first repair wiring.

20. The display apparatus according to claim 19, wherein the dummy wiring includes a same material as the drain electrode.

21. The display apparatus according to claim 14, wherein the first lower electrode and the second lower electrode include a metal, and wherein the first lower wiring layer, the second lower wiring layer, the first upper wiring layer and the second upper wiring layer includes a conductive metal oxide.

22. The display apparatus according to claim 14, wherein the first upper wiring layer and the second upper wiring layer have the same resistivity.

* * * * *